United States Patent

Lines

[11] Patent Number: 5,214,602
[45] Date of Patent: May 25, 1993

[54] DYNAMIC MEMORY WORD LINE DRIVER SCHEME

[75] Inventor: Valerie L. Lines, Ottawa, Canada

[73] Assignee: Mosaid Inc., Ontario, Canada

[21] Appl. No.: 680,746

[22] Filed: Apr. 5, 1991

[30] Foreign Application Priority Data

Apr. 6, 1990 [GB] United Kingdom ............... 9007790
Apr. 5, 1991 [GB] United Kingdom ............... 9107165

[51] Int. Cl.$^5$ .............................................. G11C 7/00
[52] U.S. Cl. ......................... 365/189.11; 365/189.06; 365/226; 365/230.06
[58] Field of Search .................... 365/189.06, 189.11, 365/226, 330.06, 156

[56] References Cited

U.S. PATENT DOCUMENTS

| | | | |
|---|---|---|---|
| 4,442,481 | 4/1984 | Brahmbhatt | 365/226 |
| 4,689,504 | 8/1987 | Raghunathan et al. | 365/226 |
| 4,716,313 | 12/1987 | Hori et al. | 365/230.06 |
| 4,814,647 | 3/1989 | Tran | 365/226 |
| 4,878,201 | 10/1989 | Nakaizumi | 365/189.11 |
| 4,888,738 | 12/1989 | Wong et al. | 365/189.06 |
| 5,031,149 | 7/1991 | Matsumoto et al. | 365/189.11 |
| 5,038,327 | 8/1991 | Akaogi | 365/230.06 |

Primary Examiner—Joseph E. Clawson, Jr.
Attorney, Agent, or Firm—Antonelli, Terry, Stout & Kraus

[57] ABSTRACT

A circuit which accurately controls the word line (pass transistor gate) driving voltage to a voltage which is both controlled and is not significantly greater than is needed to drive the word line. The elements of the present invention eliminate the need for a double-bootstrapping circuit, and ensure that no voltages exceed that necessary to fully turn on a memory cell access transistor. Accordingly, voltages in excess of that which would reduce reliability are avoided, and accurate driving voltages are obtained A DRAM is comprised of bit lines and word lines, memory cells connected to the bit lines and word lines, each memory cell being comprised of an access field effect transistor (FET) having its source-drain circuit connected between a bit line and a high logic level voltage $V_{dd}$ bit charge storage capacitor, the field effect transistor having a gate connected to a corresponding word line; a high $V_{pp}$ supply voltage source which is in excess of high logic level voltage $V_{dd}$ plus one transistor threshold voltage but less than a transistor damaging voltage; means for selecting the word line and means having an input driven by the selecting means for applying the $V_{pp}$ supply voltage level directly to the word line through the source-drain circuit of an FET. Thus an above $V_{dd}$ voltage level on the word line is achieved without the use of double boot-strap circuits.

5 Claims, 1 Drawing Sheet

DYNAMIC MEMORY WORD LINE DRIVER SCHEME

FIELD OF THE INVENTION

This invention relates to CMOS dynamic random access memories (DRAMs), and particularly to word line drivers.

BACKGROUND TO THE INVENTION

Dynamic random access memories are generally formed of a matrix of bit lines and word lines with memory cells located adjacent the intersections of the bit lines and word lines. The memory cells are enabled to provide their stored bits to the bit lines or to permit a write operation by signals carried on the word lines.

Each memory cell is typically formed of a bit storage capacitor connected to a reference voltage and through the source-drain circuit of an "access" field effect transistor to an associated bit line. The gate of the field effect transistor is connected to the word line. A logic signal carried by the word line enables the transistor, thus allowing charge to flow through the source-drain circuit of the transistor to the capacitor, or allowing charge stored on the capacitor to pass through the source-drain circuit of the access transistor to the bit line.

In order for the logic level $V_{dd}$ potential from the bit line to be stored on the capacitor, the word line must be driven to a voltage above $V_{dd}+V_{tn}$, where $V_{tn}$ is the threshold voltage of the access transistor including the effects of back bias.

During the early days of DRAM design, NMOS type FETs, that is, N-channel devices were used exclusively. In order to pass a $V_{dd}+V_{tn}$ level signal to the selected word line, the gate of the pass transistor had to be driven to at least $V_{dd}+2V_{tn}$. Furthermore, to allow sufficient drive to achieve a voltage greater than $V_{dd}+V_{tn}$ on the word line within a reasonable length of time in order to facilitate a relatively fast memory, the gate of the pass transistor is driven to a significantly higher voltage. In such devices, the word line driving signal utilized capacitors in a well-known double-boot strap circuit.

In the above circuit, the boot strapping voltage circuit is designed to exceed the voltage $V_{dd}+2V_{tn}$, in order to ensure that temperature, power supply, and process variations would never allow the pass transistor driving voltage to fall below $V_{dd}+2V_{tn}$.

However, it has been found that in small geometry VLSI memories, the high voltages provided by the boot-strap circuits can exceed the tolerable voltages in the memory, thus adversely affecting reliability.

SUMMARY OF THE INVENTION

The present invention is a circuit which accurately controls the word line (pass transistor gate) driving voltage to a voltage which is both controlled and is not significantly greater than is needed to drive the word line. The elements of the present invention eliminate the need for a double-boot-strapping circuit, and ensure that no voltages exceed that necessary to fully turn on a memory cell access transistor. Accordingly, voltages in excess of that which would reduce reliability are avoided, and accurate driving voltages are obtained.

According an embodiment of the invention a dynamic random access memory (DRAM) is comprised of bit lines and word lines, memory cells connected to the bit lines and word lines, each memory cell being comprised of an access field effect transistor (FET) having its source-drain circuit connected between a bit line and a bit charge storage capacitor, the access field effect transistor having a gate connected to a corresponding word line; a high supply voltage source $V_{pp}$; a circuit for selecting the word line and a circuit having an input driven by the selecting apparatus for applying the $V_{pp}$ supply voltage directly to the word line.

BRIEF INTRODUCTION TO THE DRAWINGS

A better understanding of the invention will be obtained by reference to the detailed description below, in conjunction with the following drawings, in which:

FIG. 1 is a schematic diagram of the invention.

DESCRIPTION OF A PREFERRED EMBODIMENT OF THE INVENTION

Figure 1:
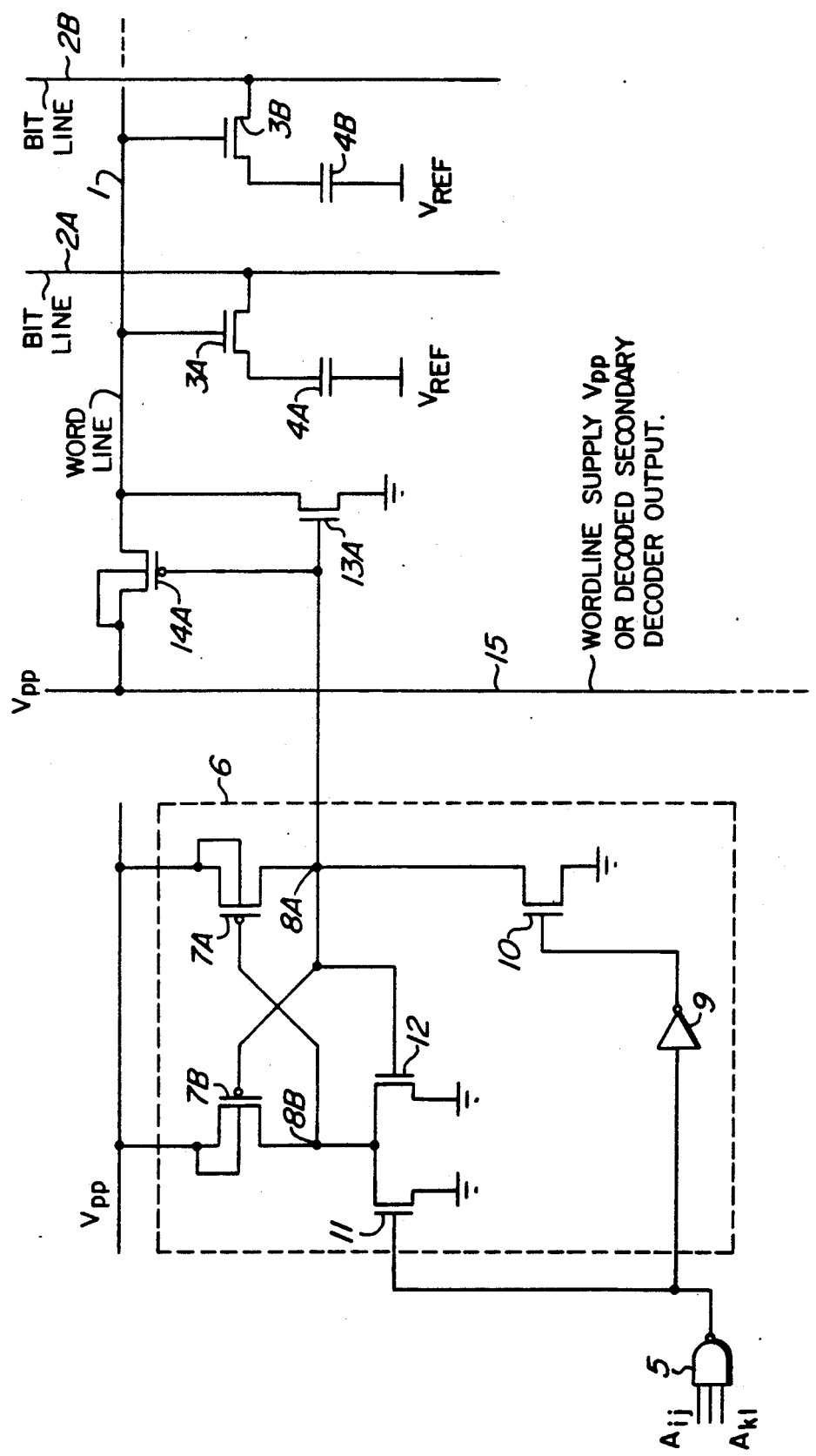

Turning now to FIG. 1, a CMOS DRAM is comprised of word lines, represented by word line 1 and bit lines, represented by bit lines 2A, 2B, etc. Access transistors 3A, 3B have their gates connected to the word line; their sources are connected to bit charge storing capacitors 4A, 4B, etc. which are also connected to ground. The drains of access transistors 3A, 3B, etc. are connected to the bit lines 2A, 2B, etc.

With the application of a logic signal of $V_{dd}+V_{tn}$ to the gate of transistor 3A, 3B, etc., $V_{dd}$ level on the bit line 2A, 2B, etc. is fully transferred to the associated capacitor 4A, 4B, etc. during the writing cycle. In the prior art it was necessary to apply a voltage greater than $V_{dd}+2V_{tn}$ to the gate of an N-channel pass transistor in order to ensure that a voltage in excess of $V_{dd}+V_{tn}$ would be available at the gates of transistors 3A, 3B, etc.

The combination of a bit storing charge capacitor, e.g. 4A, with an associated access transistor, e.g. 3A, forms a memory cell in prior art DRAMs.

The word line is selected by means of addresses $A_{ij}$ applied to the inputs of a NAND gate 5. In the prior art a double boot-strap circuit was connected between the output of NAND gate 5 and the word line.

In accordance with the present invention a voltage $V_{pp}$ which is higher than the logic level $V_{dd}+V_{tn}$ is utilized. A level shifter 6 is formed of a pair of cross coupled P-channel transistors 7A and 7B. The sources of transistors 7A and 7B are connected to the voltage source $V_{pp}$. The level shifter defines a first and a second control node, respectively 8A and 8B.

The output of NAND gate 5 is connected through an inverter 9 to the gate of an N-channel FET 10. FET 10 has its source connected to ground and its drain connected to control node 8A.

The output of NAND gate 5 is connected to the gate of an N-channel FET 11, which has its source connected to ground and its drain connected to control node 8B. A third N-channel FET 12 has its source connected to ground, its drain connected to the drain of transistor 11, and its gate to control node 8A.

Control node 8A (or a buffered version of control node 8A) is applied to the gate of pass transistor 14A and pull down transistor 13A. The source of pass transistor 14A is connected to $V_{pp}$ or to a secondary decoder output which provides a $V_{ss}$ or $V_{pp}$ level output; its drain to word line 1. The source of pull down transistor 13A is connected to ground; the drain is connected to word line 1.

In operation, assume that the word line 1 has not been selected. At least one address input of NAND gate 5 is low, causing the output of NAND gate 5 to be high, and the output of inverter 9 to be low. Transistor 11 is enabled, pulling node 8B to ground. Transistor 10 is disabled, allowing transistor 7A to charge node 8A to $V_{pp}$. Transistor 12 is thus enabled ensuring that node 8A is pulled high. The $V_{pp}$ level node 8A disables the pass device 14A and enables pull down transistor 13A so that word line 1 is held at ground. Thus transistors 3A and 3B are not enabled and are not conducting. The charge stored on capacitors 4A and 4B are thus maintained, and are not read to the bit lines.

Assume now that word line 1 is selected. Logic high level address signals at the voltage level $V_{dd}$ are applied to the inputs of NAND gate 5. The output of the NAND gate thus goes to low level. The output of inverter 9 changes to high level, transistor 10 is enabled, and pulls node 8A toward ground. This causes transistor 7B to be enabled, and pull node 8B toward $V_{pp}$. This causes transistor 7A to be disabled so that node 8A is pulled to ground, disabling transistor 12 and allowing transistor 7B to charge node 8B to $V_{pp}$. The ground level voltage on node 8A disables pull down transistor 13A, and enables the pass transistor 14A so that the word line 1 is driven to a $V_{pp}$ level. The voltage on the word line is thus controlled, and depending on whether the word line is selected or not, it switches between ground and $V_{pp}$. With the voltage $V_{pp}$ being controlled to $V_{dd}+V_{tn}$, the voltage at the gates of the cell access transistors 3A and 3B is certain to be $V_{dd}+V_{tn}$. However the voltage $V_{pp}$ is selected to be less than a voltage that would deteriorate reliability of the DRAM.

A person understanding this invention may now conceive of alternative structures and embodiments or variations of the above. All of those which fall within the scope of the claims appended hereto are considered to be part of the present invention.

I claim:

1. A dynamic random access memory (DRAM) comprising bit lines and word lines, memory cells connected to the bit lines and word lines, each memory cell being comprised of an access field effect transistor (FET) having its source-drain circuit connected between a bit line and a high logic level voltage $V_{dd}$ bit charge storage capacitor, the field effect transistor having a gate connected to a corresponding word line; a high $V_{pp}$ supply voltage source which is in excess of high logic level voltage $V_{dd}$ plus one transistor threshold voltage but less than a transistor damaging voltage; means for selecting the word line and means having an input driven by the selecting means for applying the $V_{pp}$ supply voltage level directly to the word line through the source-drain circuit of an FET.

2. A DRAM as defined in claim 1 in which said selecting means is comprised of means for receiving $V_{dd}$ level logic inputs and for providing an output to said applying means at $V_{pp}$ logic levels, the level $V_{pp}$ being higher than the supply voltage $V_{dd}$.

3. A DRAM as defined in claim 2 in which the applying means is comprised of a level shifter connected to said high supply voltage source having an output connected to the gate of a pass transistor whose source is connected to said high supply voltage source, said word line and level shifter driving means being connected between the level shifter and ground, the level shifter driving means being connected to the output of the selecting means.

4. A DRAM as defined in claim 3 in which the level shifter is comprised of a pair of cross coupled P-channel FETs, the level shifter having a pair of control nodes and a power supply node, the power supply node being connected to said high supply voltage source, one of the control nodes forming said output, the level shifter driving means being comprised of an input connected to the output of the selecting means, an inverter having an input connected to said output of the selecting means, a pair of N-channel FETs each having source-drain circuits connected between a corresponding one of said control nodes and ground, the gate of one of said N-channel FETs which is connected to said one control node being connected to the output of said inverter, and the gate of the other N-channel FET being connected to said output of the selecting means.

5. A DRAM as defined in claim 1 in which said selecting means is comprised of a NAND gate.

* * * * *

UNITED STATES PATENT AND TRADEMARK OFFICE
CERTIFICATE OF CORRECTION

PATENT NO.     : 5,214,602
DATED          : May 25, 1993
INVENTOR(S)    : Valerie L. Lines It is certified that error appears in the above-identified patent and that said Letters Patent is hereby corrected as shown below:

Column 4,
Lines 20-21, delete "said word line".

Signed and Sealed this

Ninth Day of December, 2003

JAMES E. ROGAN
*Director of the United States Patent and Trademark Office*